US008055985B2

United States Patent
Nakagawa (10) Patent No.: US 8,055,985 B2
(45) Date of Patent: Nov. 8, 2011

(54) DECODING METHOD AND DECODING CIRCUIT

(75) Inventor: Takashi Nakagawa, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 951 days.

(21) Appl. No.: 12/007,861

(22) Filed: Jan. 16, 2008

(65) Prior Publication Data
US 2008/0222497 A1    Sep. 11, 2008

(30) Foreign Application Priority Data
Mar. 9, 2007    (JP) .................................. 2007-059727

(51) Int. Cl.
*H03M 13/00*    (2006.01)

(52) U.S. Cl. ........................ 714/785; 714/759
(58) Field of Classification Search .................. 704/219; 714/755, 784, 793, 785, 759
See application file for complete search history.

(56) References Cited

U.S. PATENT DOCUMENTS

| 4,468,769 | A  | * | 8/1984  | Koga ............................. 714/759 |
| 4,604,747 | A  | * | 8/1986  | Onishi et al. ................... 714/755 |
| 5,430,739 | A  | * | 7/1995  | Wei et al. ....................... 714/784 |
| 6,671,852 | B1 | * | 12/2003 | Ariel et al. ..................... 714/793 |
| 7,103,829 | B2 |   | 9/2006  | Van Dijk et al. |
| 7,505,899 | B2 | * | 3/2009  | Serizawa ....................... 704/219 |
| 7,725,800 | B2 | * | 5/2010  | Yang et al. .................... 714/755 |

FOREIGN PATENT DOCUMENTS

| JP | 7-202907 (A)    | 8/1995  |
| JP | 9-162753 (A)    | 6/1997  |
| JP | 2004-520679 (A) | 6/1997  |
| JP | 2000-286718 A   | 10/2000 |

* cited by examiner

*Primary Examiner* — David Ton
(74) *Attorney, Agent, or Firm* — Foley & Lardner LLP

(57) ABSTRACT

An approach to dividing syndrome calculations into two steps and serially processing them requires a long time for the syndrome calculations with respect to an entire decoding process. Therefore, there is disclosed an error correction decoding circuit for a playing signal having a code sequence having a decoding unit generating first decoded signal and second decoded signal based on the code sequence and an error correction unit performing error correction for the second signal in response to the first signal.

10 Claims, 11 Drawing Sheets

DECODING METHOD AND DECODING CIRCUIT

BACKGROUND OF THE INVENTION

1. Field of the Invention

The present invention relates to a decoding method and a decoding circuit, and more particularly to a decoding method and a decoding circuit which decode position information (addresses) on an optical disk.

2. Description of the Related Art

In recent years, a recording and playing apparatus using an optical disk has been paid attention to because of reasons of its compactness, high capacity and the like.

Figure 5:
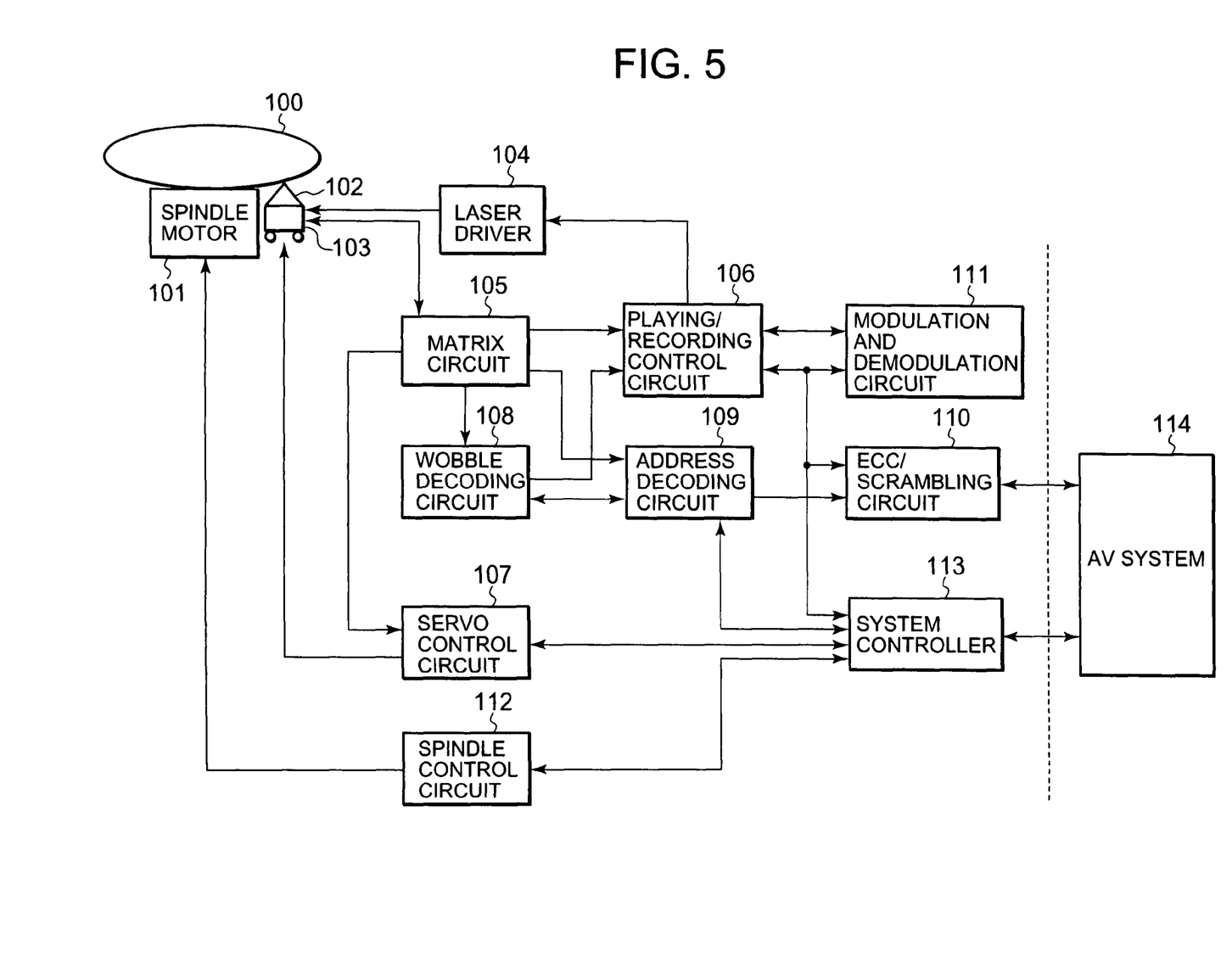
FIG. 5 is a block diagram showing a whole image of an optical disk recording and playing apparatus.
Figure 6:
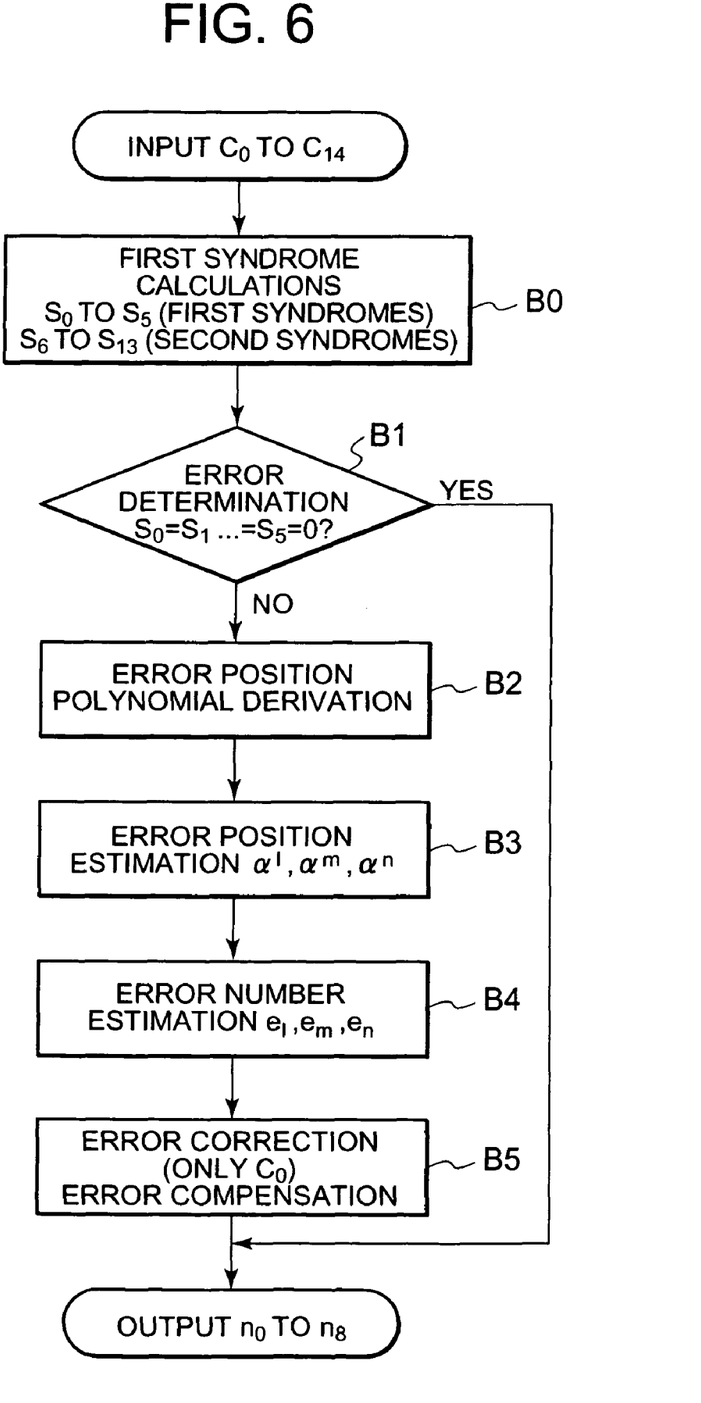
FIG. 6 is a flowchart showing an error correction decoding flow of the present invention.

FIG. 5 shows an overall view of such a conventional recording and playing apparatus. An optical disk 100 is rotatably driven by a spindle motor 101 at the time of recording and playing operations, and data is recorded in the disk 100 or data is played from the disk 100 by an optical pickup.

A pickup 102 has a laser diode which becomes a laser source, a photodetector for detecting a reflected light, and an objective lens which becomes an output end of a laser light, and illuminates the laser light onto a disk recording surface. This pickup 102 can move in a radial direction of the disk by a thread mechanism 103. Reflected light information from the disk 100 is detected by the photodetector, converted into an electrical signal depending on an amount of received light, and supplied to a matrix circuit 105.

The matrix circuit 105 generates a play data signal, a focus error signal for servo control, a tracking error signal, wobble information and the like. The play data signal outputted from the matrix circuit 105 is supplied to a playing/recording control circuit 106, the focus error signal and the tracking error signal are supplied to a servo control circuit 107, and the wobble information is supplied to a wobble decoding circuit 108, respectively. (The wobble information will be described later.)

If the disk 100 is a rewritable disk, the wobble decoding circuit 108 supplies ADIP information which has been MSK-demodulated or HMW-demodulated by using the wobble information, to an address decoding circuit 109. The address decoding circuit 109 performs an error detection/correction process with respect to the ADIP information and decodes addresses on the disk.

At the time of recording, recorded data is transferred from an AV system 114, sent to and buffered in a memory of an ECC/scrambling circuit 110, and addition of an error correction code, a scrambling process, addition of a subcode or the like is performed thereto. Moreover, data which has been ECC-encoded and subjected to the scrambling process is applied with modulation of an RLL (1-7) PP scheme in a modulation and demodulation circuit 111 and supplied as an encoded data to the playing/recording control circuit 106.

The playing/recording control circuit 106 sends a laser pulse converted from the encoded data based on the addresses on the disk, to a laser driver 104. The laser driver 104 performs laser emission driving and forms pits depending on the recorded data on the disk 100.

A spindle control circuit 112 controls to rotate the spindle motor 101. The spindle control circuit 112 obtains a clock generated in a PLL process with respect to a wobble signal as current rotation speed information on the spindle motor 101, compares this information with predetermined speed information, and thereby generates a spindle error signal.

The above described recording and playing operations are controlled by a system controller 113 formed with a microcomputer. The system controller 113 executes recording and playing processes based on commands from the AV system 114.

Here, on a recording film of the optical disk, a groove for guiding the laser light is formed along a recording track. This groove winds its way (wobbling) with a substantially constant period, which is referred to as "wobble". The wobble is locally applied with phase modulation, and position information (addresses) on the optical disk, which is required at the time of recording and playing, is embedded therein. These addresses are coded based on a predetermined generation polynomial, converted into wobble patterns having different periods and amplitudes, and embedded on the optical disk.

In order to decode a code sequence of the addresses embedded on the optical disk in this way and extract the address information, it is necessary to perform error detection and correction with respect to the code sequence by first syndrome calculations, and perform second syndrome calculations to extract the address information from the code sequence in which the error detection and correction have been performed.

A flow of decoding the above described code sequence into the address information will be described in detail. A code sequence C0 to C(i−1) is obtained from a bit column of ADIP (Address in Pre groove) obtained from the wobble patterns on the optical disk. Here, it is assumed that the code sequence C0 to C(i−1) is composed in units of nibbles (4 bits) per symbol. If it is assumed that there is no error in this code sequence C0 to C(i−1), C0 to C(i−1) are used to extract address information n0 to n(j−2). n0 to n(j−2) can be calculated by applying C0 to C(i−1) to a second syndrome calculation formula (1) for extracting the address information.

[Formula 1]

$$S_u = \sum_{t=0}^{i-1} C_t * (\alpha^u)^{(i-1)-t} \quad (i-j) \le u \le (i-2) \\ n_{u-(i-j)} = S_u \quad (i-j) \le u \le (i-2) \quad (1)$$

In the formula (1), i denotes a code length, j denotes an information length, and u denotes a syndrome number. Moreover, α denotes a primitive element on a Galois field ($2^4$).

Figure 1:
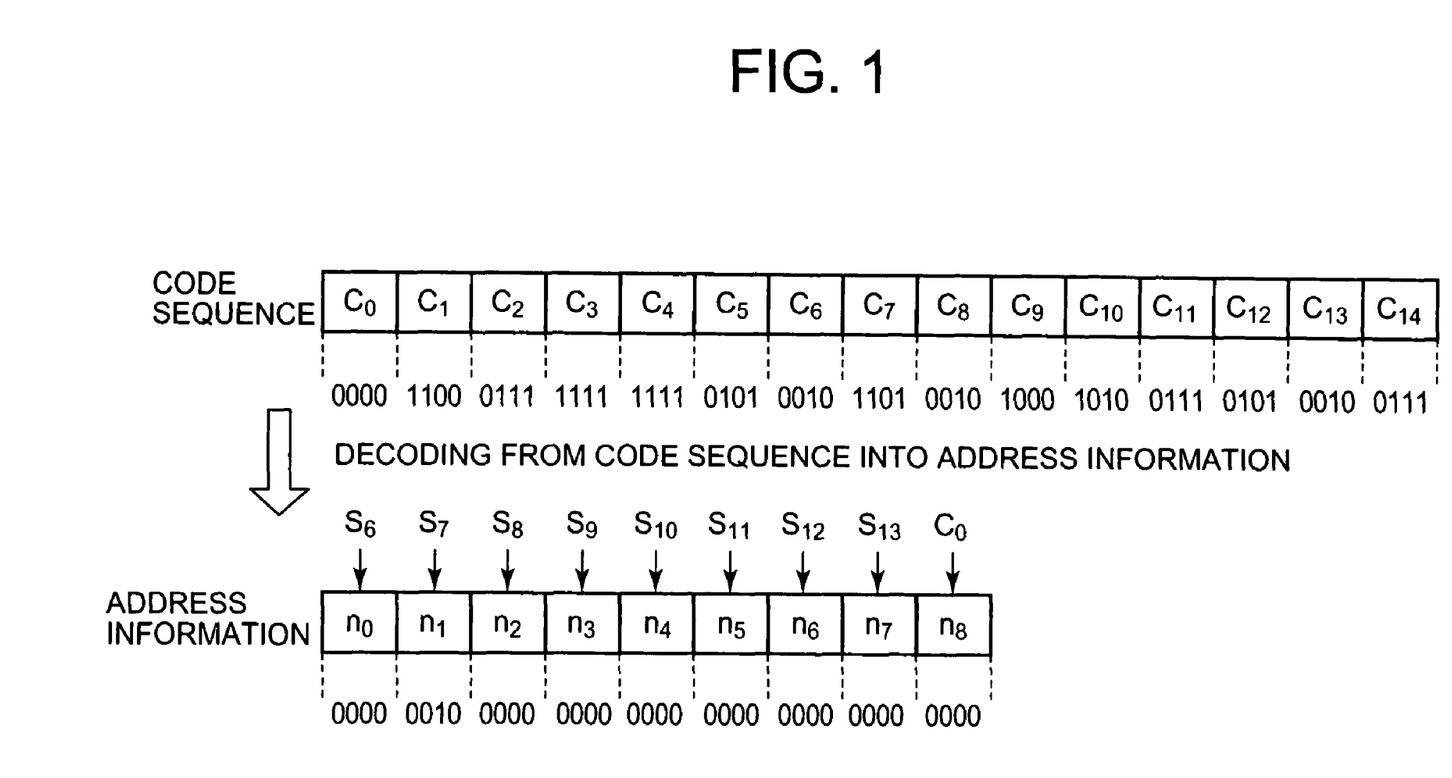
FIG. 1 is a diagram showing a method of decoding from a code sequence into address information (in the case where there is no error in the code sequence)
Figure 2:
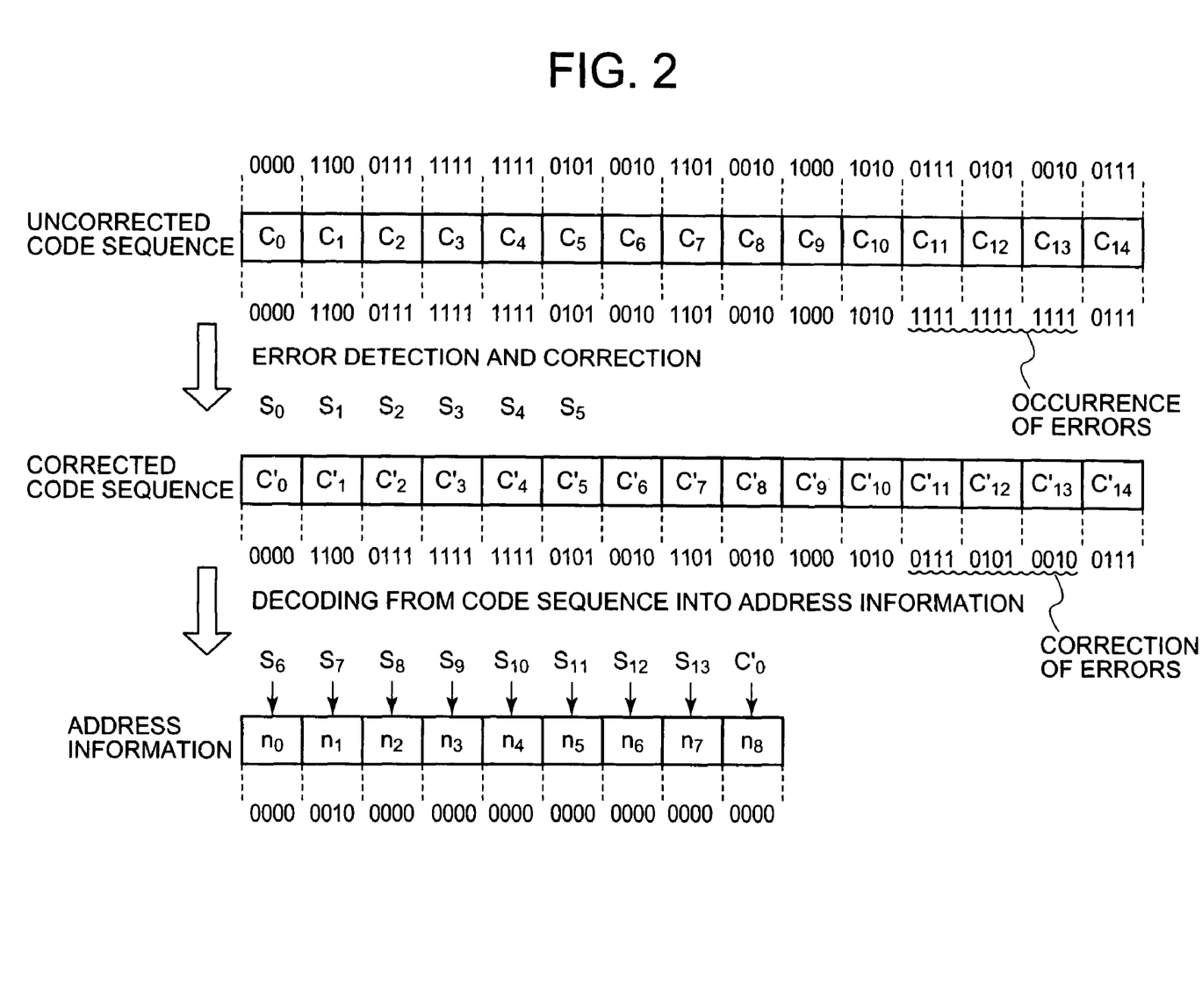
FIG. 2 is a diagram showing the method of decoding from the code sequence into the address information (in the case where there is an error in the code sequence)

If the code length i=15 and the information length j=9 are assumed, the above described formula (1) is developed into a formula (2). As shown in FIG. 1, decoding into address information n0 to n8 is performed by assigning a code sequence C0 to C14 to a formula (4).

[Formula 2]

$$\left.\begin{aligned}
n_0 &= S_6 = C_0(\alpha^6)^{14} + C_1(\alpha^6)^{13} + C_2(\alpha^6)^{12} + \ldots + C_{12}(\alpha^6)^2 + C_{13}(\alpha^6)^1 + C_{14}(\alpha^6)^0 \\
n_1 &= S_7 = C_0(\alpha^7)^{14} + C_1(\alpha^7)^{13} + C_2(\alpha^7)^{12} + \ldots + C_{12}(\alpha^7)^2 + C_{13}(\alpha^7)^1 + C_{14}(\alpha^7)^0 \\
n_2 &= S_8 = C_0(\alpha^8)^{14} + C_1(\alpha^8)^{13} + C_2(\alpha^8)^{12} + \ldots + C_{12}(\alpha^8)^2 + C_{13}(\alpha^8)^1 + C_{14}(\alpha^8)^0 \\
n_3 &= S_9 = C_0(\alpha^9)^{14} + C_1(\alpha^9)^{13} + C_2(\alpha^9)^{12} + \ldots + C_{12}(\alpha^9)^2 + C_{13}(\alpha^9)^1 + C_{14}(\alpha^9)^0 \\
n_4 &= S_{10} = C_0(\alpha^{10})^{14} + C_1(\alpha^{10})^{13} + C_2(\alpha^{10})^{12} + \ldots + C_{12}(\alpha^{10})^2 + C_{13}(\alpha^{10})^1 + C_{14}(\alpha^{10})^0 \\
n_5 &= S_{11} = C_0(\alpha^{11})^{14} + C_1(\alpha^{11})^{13} + C_2(\alpha^{11})^{12} + \ldots + C_{12}(\alpha^{11})^2 + C_{13}(\alpha^{11})^1 + C_{14}(\alpha^{11})^0 \\
n_6 &= S_{12} = C_0(\alpha^{12})^{14} + C_1(\alpha^{12})^{13} + C_2(\alpha^{12})^{12} + \ldots + C_{12}(\alpha^{12})^2 + C_{13}(\alpha^{12})^1 + C_{14}(\alpha^{12})^0 \\
n_7 &= S_{13} = C_0(\alpha^{13})^{14} + C_1(\alpha^{13})^{13} + C_2(\alpha^{13})^{12} + \ldots + C_{12}(\alpha^{13})^2 + C_{13}(\alpha^{13})^1 + C_{14}(\alpha^{13})^0 \\
n_8 &= C_0
\end{aligned}\right\} \quad (2)$$

On the other hand, if it is assumed that there is an error in the above described code sequence C0 to C(i−1), a first syndrome calculation (3) is performed to perform the error detection and correction with respect to C0 to C(i−1), and subsequently, a second syndrome calculation (4) is performed to extract the address information n0 to n(j−2) from a code sequence C'0 to C'(i−1) applied with the error correction.

First, C0 to C(i−1) are applied to the first syndrome calculation (3) and thereby syndrome values S0 to S5 for calculating error position and error number information required for the error detection and correction are obtained. The error detection and correction are performed by using these syndrome values.

[Formula 3]

$$S_v = \sum_{t=0}^{i-1} C_t * (\alpha^v)^{(i-1)-t} \quad 0 \leq v \leq (i-j-1) \quad (3)$$

-continued

[Formula 4]

$$\left.\begin{aligned}
S'_u &= \sum_{t=0}^{i-1} C'_t * (\alpha^u)^{(i-1)-t} \quad (i-j) \leq u \leq (i-2) \\
n_{u-(i-j)} &= S'_u \quad (i-j) \leq u \leq (i-2)
\end{aligned}\right\} \quad (4)$$

In the formulas (3) and (4), i denotes the code length, j denotes the information length, and v and u denote the syndrome number. Moreover, $\alpha$ denotes a primitive element on a Galois field ($2^4$).

Figure 3:
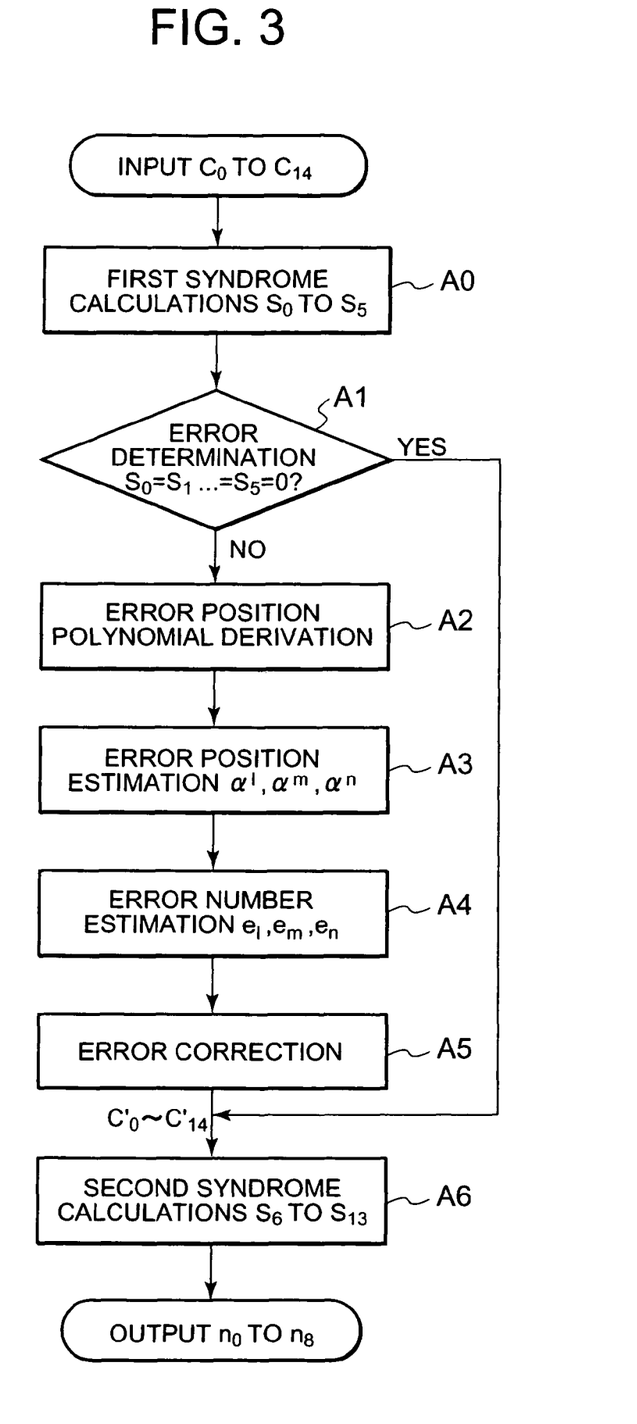
FIG. 3 is a flowchart showing an error correction decoding flow applied with an approach shown in Japanese Patent Laid-Open No. 2000-286718.

If the code length i=15 and the information length j=9 are assumed, the above described formulas (3) and (4) are developed into formulas (5) and (6). FIG. 3 shows a process of decoding from the code sequence C0 to C14 into the address information n0 to n8 in the case where it is assumed that there are errors in C10, C11 and C12.

[Formula 5]

$$\left.\begin{aligned}
S_0 &= C_0(\alpha^0)^{14} + C_1(\alpha^0)^{13} + C_2(\alpha^0)^{12} + \ldots + C_{12}(\alpha^0)^2 + C_{13}(\alpha^0)^1 + C_{14}(\alpha^0)^0 \\
S_1 &= C_0(\alpha^1)^{14} + C_1(\alpha^1)^{13} + C_2(\alpha^1)^{12} + \ldots + C_{12}(\alpha^1)^2 + C_{13}(\alpha^1)^1 + C_{14}(\alpha^1)^0 \\
S_2 &= C_0(\alpha^2)^{14} + C_1(\alpha^2)^{13} + C_2(\alpha^2)^{12} + \ldots + C_{12}(\alpha^2)^2 + C_{13}(\alpha^2)^1 + C_{14}(\alpha^2)^0 \\
S_3 &= C_0(\alpha^3)^{14} + C_1(\alpha^3)^{13} + C_2(\alpha^3)^{12} + \ldots + C_{12}(\alpha^3)^2 + C_{13}(\alpha^3)^1 + C_{14}(\alpha^3)^0 \\
S_4 &= C_0(\alpha^4)^{14} + C_1(\alpha^4)^{13} + C_2(\alpha^4)^{12} + \ldots + C_{12}(\alpha^4)^2 + C_{13}(\alpha^4)^1 + C_{14}(\alpha^4)^0 \\
S_5 &= C_0(\alpha^5)^{14} + C_1(\alpha^5)^{13} + C_2(\alpha^5)^{12} + \ldots + C_{12}(\alpha^5)^2 + C_{13}(\alpha^5)^1 + C_{14}(\alpha^5)^0
\end{aligned}\right\} \quad (5)$$

-continued

[Formula 6]

$$S'_6 = C'_0(\alpha^6)^{14} + C'_1(\alpha^6)^{13} + C'_2(\alpha^6)^{12} + \ldots + C'_{12}(\alpha^6)^2 + C'_{13}(\alpha^6)^1 + C'_{14}(\alpha^6)^0$$
$$S'_7 = C'_0(\alpha^7)^{14} + C'_1(\alpha^7)^{13} + C'_2(\alpha^7)^{12} + \ldots + C'_{12}(\alpha^7)^2 + C'_{13}(\alpha^7)^1 + C'_{14}(\alpha^7)^0$$
$$S'_8 = C'_0(\alpha^8)^{14} + C'_1(\alpha^8)^{13} + C'_2(\alpha^8)^{12} + \ldots + C'_{12}(\alpha^8)^2 + C'_{13}(\alpha^8)^1 + C'_{14}(\alpha^8)^0$$
$$S'_9 = C'_0(\alpha^9)^{14} + C'_1(\alpha^9)^{13} + C'_2(\alpha^9)^{12} + \ldots + C'_{12}(\alpha^9)^2 + C'_{13}(\alpha^9)^1 + C'_{14}(\alpha^9)^0$$
$$S'_{10} = C'_0(\alpha^{10})^{14} + C'_1(\alpha^{10})^{13} + C'_2(\alpha^{10})^{12} + \ldots + C'_{12}(\alpha^{10})^2 + C'_{13}(\alpha^{10})^1 + C'_{14}(\alpha^{10})^0 \quad (6)$$
$$S'_{11} = C'_0(\alpha^{11})^{14} + C'_1(\alpha^{11})^{13} + C'_2(\alpha^{11})^{12} + \ldots + C'_{12}(\alpha^{11})^2 + C'_{13}(\alpha^{11})^1 + C'_{14}(\alpha^{11})^0$$
$$S'_{12} = C'_0(\alpha^{12})^{14} + C'_1(\alpha^{12})^{13} + C'_2(\alpha^{12})^{12} + \ldots + C'_{12}(\alpha^{12})^2 + C'_{13}(\alpha^{12})^1 + C'_{14}(\alpha^{12})^0$$
$$S'_{13} = C'_0(\alpha^{13})^{14} + C'_1(\alpha^{13})^{13} + C'_2(\alpha^{13})^{12} + \ldots + C'_{12}(\alpha^{13})^2 + C'_{13}(\alpha^{13})^1 + C'_{14}(\alpha^{13})^0$$
$$n_0 = S'_6$$

$$n_1 = S'_7$$
$$n_2 = S'_8$$
$$n_3 = S'_9$$
$$n_4 = S'_{10}$$
$$n_5 = S'_{11}$$
$$n_6 = S'_{12}$$
$$n_7 = S'_{13}$$
$$n_8 = C'_0$$

In an address format described above, in order to decode the address information n0 to n(j−2) from the code sequence C0 to C(i−1), the syndrome calculations having two steps, that is, first syndrome calculations S0 to S(i−j−1) for performing the error detection and correction and second syndrome calculations S(i−j) to S(i−2) for extracting the address information, are required.

As a configuration for realizing such two-step syndrome calculations, there is an approach to sequentially processing the two-step syndrome calculations step by step, as shown in Japanese Patent Laid-Open No. 2000-286718.

Assuming the code length i=15 and the information length j=9, an approach to decoding the address information n0 to n(j−2) from the code sequence C0 to C(i−1) according to the configuration shown in Patent Document 1 will be described. In FIG. 3, first, C0 to C14 are inputted and first syndromes S0 to S5 are calculated as the first step (step A0).

Next, according to error determination with S0 to S5 (step A1), if it is determined that there is no error in C0 to C14 (S0 to S5 are all zero), second syndromes S6 to S13 are calculated as the second step (step A6), and the address information n0 to n7 is outputted. Moreover, C0 is outputted as n8.

On the other hand, according to the above described error determination (step A1), if it is determined that there is an error in C0 to C14 (at least one of S0 to S5 is not zero), S0 to S5 are used to perform the error correction with respect to C0 to C14. First, an error position polynomial is derived (step A2), and subsequently, error positions αl, αm and αn and error numbers el, em and en are calculated (steps A3 and A4), and then a code sequence C'0 to C'14 in which the errors have been corrected is generated (step A5).

Next, these C'0 to C'14 are used to execute the syndrome calculations at the second step to calculate S6 to S13, and n0 to n7 are outputted as estimated values for the address information (step A6). Moreover, C'0 is outputted as n8.

Figure 4:
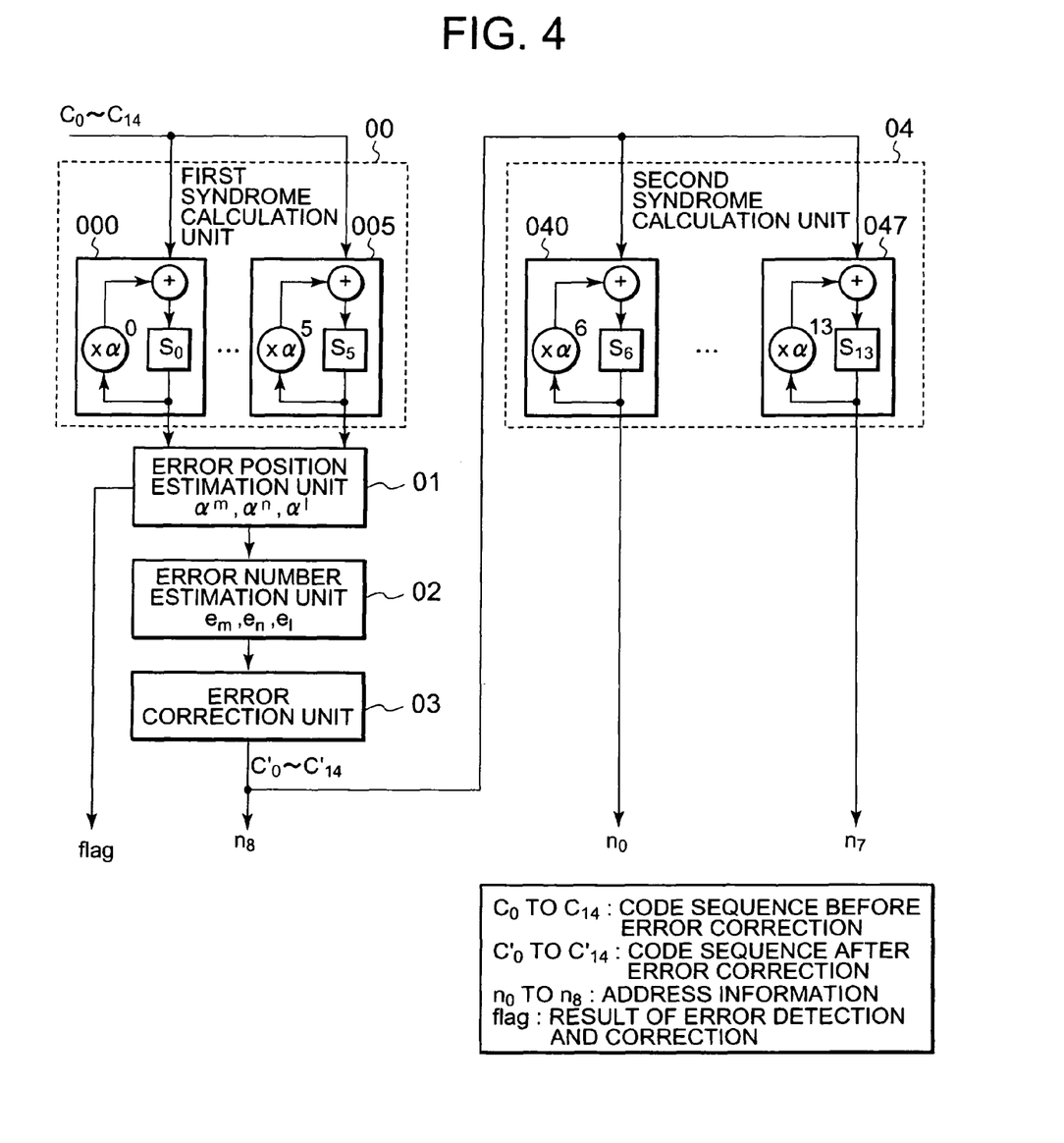
FIG. 4 is a block diagram showing a configuration example of an error correction decoding apparatus applied with the approach shown in Japanese Patent Laid-Open No. 2000-286718.

FIG. 4 shows an error correction decoding apparatus applied with a processing scheme according to Patent Document 1, and is a configuration diagram in the case of assuming the code length i=15 and the information length j=9. The error correction decoding apparatus in FIG. 4 is configured with a first syndrome calculation unit 00 which inputs C0 to C14 and calculates S0 to S5, an error position estimation unit 01 which determines the error positions in C0 to C14, an error number estimation unit 02 which determines the error numbers in C0 to C14, an error correction unit 03 which performs the error correction with respect to C0 to C14, and a second syndrome calculation unit 04 which inputs C'0 to C'14 and calculates S6 to S13.

Next, an operation of the error correction decoding apparatus in FIG. 4 will be described. First, the first syndrome calculation unit 00 inputs C0 to C14 and product-sum repeat circuits 000 to 005 calculate S0 to S5.

Next, the error position estimation unit 01 derives the error position polynomial from a solution of simultaneous equations of S0 to S5, and estimates the error positions. Moreover, the error number estimation unit 02 estimates the error numbers from the solution of the simultaneous equations of S0 to S5.

Next, the error correction unit 03 performs the error correction with respect to C0 to C14 based on the above described error positions and error numbers, and generates C'0 to C'14.

Next, the second syndrome calculation unit 04 inputs C'0 to C'14, product-sum repeat circuits 040 to 047 calculate S6 to S13, and its result is outputted as the address information n0 to n7. Moreover, C'0 is outputted as n8.

[Patent Document 1] Japanese Patent Laid-Open No. 2000-286718

The above described decoding process is processed in an address decoding process within the recording and playing apparatus for the optical disk in the address format requiring two-step syndrome calculations.

When the approach shown in Patent Document 1 is applied in the above described address format, in an error correction decoding method, the first syndrome calculations S0 to S(i−j−1) for performing the error detection and correction and the second syndrome calculations S(i−j) to S(i−2) for extracting the address information are divided into two steps, and after the first syndrome calculations have been completed and the errors in the code sequence to be used in the second syndrome calculations have been corrected, the above described code sequence C'0 to C'14 after the error correction is used to perform the second syndrome calculations. Therefore, it is necessary to execute the first syndrome calculations and the second syndrome calculations in this order.

Generally, if a product-sum repeat calculation is used to perform the syndrome calculations, product-sum calculations are performed while one symbol of C0 to C(i−1) is repeatedly inputted per cycle. Therefore, a time required for the syndrome calculations per step is the number of cycles equal to the code length (i cycles).

For example, first, in order to perform the error determination, it is necessary to obtain the first syndromes S0 to S(i−j−1), and the calculation time at this first step requires i cycles. According to a result of the above described error determination, if there is no error in C0 to C(i−1), it is necessary to obtain the second syndromes S(i−j) to S(i−2) in order to decode the address information, and the calculation time at this second step requires i cycles. As a result, the entire decoding process requires a processing time of 2*i cycles.

On the other hand, according to the result of the above described error determination, if there is the error in C0 to C(i−1), the error correction is performed with respect to C0 to C(i−1). However, since a time required for the correction varies depending on the number of errors, the time is assumed as e cycles here. Next, it is necessary to use C'0 to C'(i−1) to calculate the second syndromes S(i−j) to S(i−2) in order to decode the address information, and the calculation time at this second step requires i cycles. As a result, the entire decoding process requires the processing time of 2*i+e cycles.

In this way, in the conventional approach to dividing the syndrome calculations into two steps and processing them as shown in Patent Document 1, the syndrome calculation time occupies a high percentage of the entire decoding process.

SUMMARY

In accordance with the present invention, there is disclosed an error correction decoding circuit for a playing signal having a code sequence having a decoding unit generating first decoded signal and second decoded signal based on the code sequence and an error correction unit performing error correction for the second signal in response to the first signal.

DETAILED DESCRIPTION OF THE PREFERRED EMBODIMENTS

This embodiment can reduce a time required for first and second syndrome calculations by parallelly executing the first and second syndrome calculations which have been serially executed. Details thereof will be described below by using the drawings.

Figure 7:
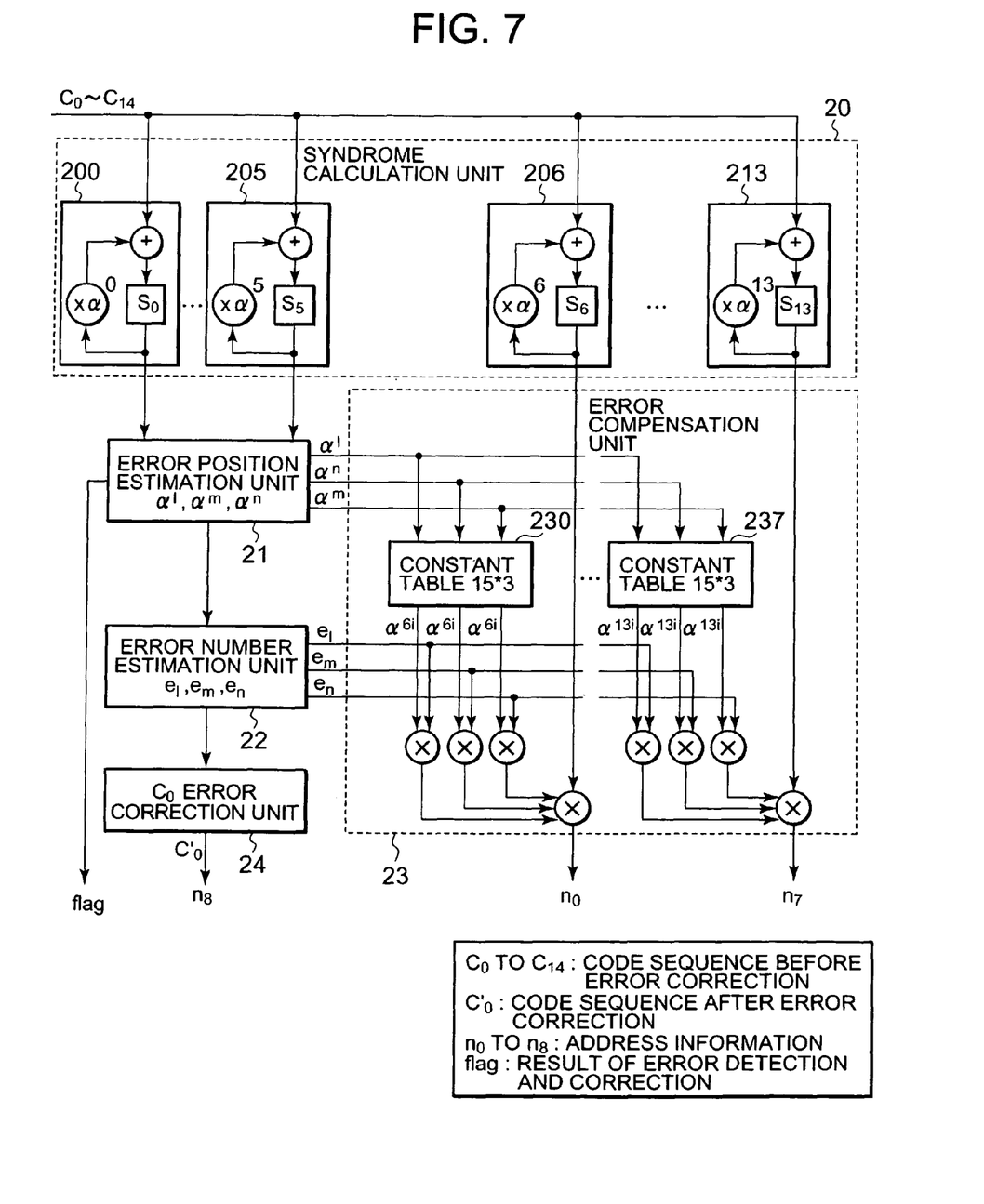
FIG. 7 is a block diagram showing a configuration example of an error correction decoding apparatus of the present invention.

FIG. 7 shows an error correction decoding apparatus which is applied to the embodiment of the present invention in the case of assuming a code length i=15 and an information length j=9. The error correction decoding apparatus is configured with a syndrome calculation unit 20 which inputs C0 to C14 and calculates S0 to S13, an error position estimation unit 21 which determines error positions in C0 to C14, an error number estimation unit 22 which determines error numbers in C0 to C14, an error compensation unit 23 which compensates an amount of errors included in S6 to S13 obtained by the syndrome calculation unit 20, and an C0 error correction unit 24 which generates n8.

In this configuration, product-sum repeat circuits 200 to 205 which perform the first syndrome calculations and product-sum repeat circuits 206 to 213 which perform the second syndrome calculations parallelly execute the calculations. Subsequently, based on outputs of the first syndrome calculations (outputs of the product-sum repeat circuits 200 to 205), the error position estimation unit 21 outputs signals αl, αm and αn for identifying the error positions. The error number estimation unit 22 receives the outputs of the first syndrome calculations and the output of the error position estimation unit 21, and outputs signals el, em and en for determining the error numbers by the C0 error correction unit 24. The error compensation unit 23 receives outputs of the second syndrome calculations, that is, outputs of the product-sum repeat circuits 206 to 213, the signals αl, αm and αn for identifying the error positions from the error position estimation unit 21, and the signals el, em and en for determining the error numbers from the error number estimation unit 22, and outputs address information n0 to n7 after error correction. In this way, the address information in which errors have been compensated can be obtained while the first syndromes and the second syndromes are parallelly calculated, by providing the error compensation unit which receives the outputs of the second syndrome calculations, the output of the error position estimation unit 21 and the output of the error number estimation unit 22 and compensates the errors.

Next, an operation of the error correction decoding apparatus in FIG. 7 will be described. First, the syndrome calculation unit 20 inputs C0 to C14, and the product-sum repeat circuits 200 to 205 and 206 to 213 parallelly calculate first syndromes S0 to S5 and second syndromes S6 to S13, respectively.

Next, the error position estimation unit 21 derives an error position polynomial from a solution of simultaneous equations of S0 to S5 and estimates the error positions. Moreover, the error number estimation unit 22 estimates the error numbers from the solution of the simultaneous equations of S0 to S5.

Next, the error compensation unit 23 estimates the amount of errors included in S6 to S13 from error information on C0 to C14 by using a Galois field adder/multiplier, adds the amount of errors as an compensation value to S6 to S13 which have been already obtained, and outputs n0 to n7 as the address information.

Moreover, in a process of obtaining the above described compensation value, constant tables 230 to 237 are used as circuits for obtaining exponentiation values of the error positions $\alpha l$, $\alpha m$ and $\alpha n$, which is intended to further speed up the process. Since objects to be exponentiated are constants ($\alpha 6$ to $\alpha 13$) and furthermore the number of exponentiations is 0 to 14, which means a small number of patterns, a table configuration is enabled.

Moreover, the error-correction unit 24 performs the error correction with respect to C0 in parallel with the above described compensation process and obtains n8.

Figure 8:
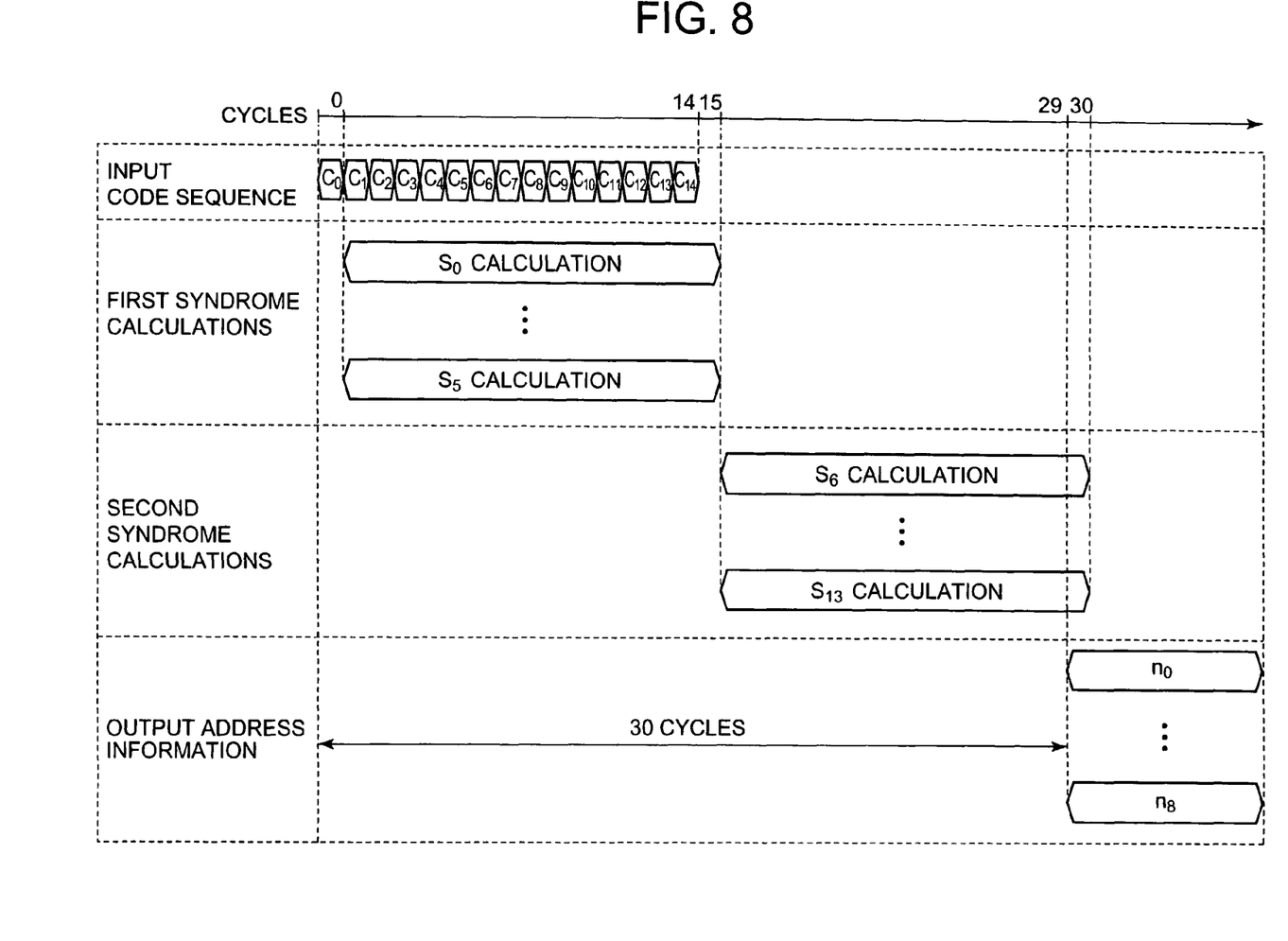
FIG. 8 is a timing chart showing a processing time for the error correction decoding apparatus applied with the approach shown in Japanese Patent Laid-Open No. 2000-286718 (in the case where there is no error in the code sequence)

If there is no error in C0 to C(i−1), a processing time for an error correction decoding method of dividing the syndrome calculations into two steps as shown in Patent Document 1 is (2*i) cycles, whereas a processing time for the present invention is i cycles, which enables a high speed decoding process. FIG. 8 shows the processing time for the approach of Patent Document 1 and FIG. 9 shows the processing time for the present invention, in the case where the code length i=15 and the information length j=9 are assumed and there is no error in a code sequence.

In a timing chart showing the approach according to Patent Document 1 as shown in FIG. 8, when C0 to C14 have been inputted as the code sequence, the calculations of S0 to S5 are completed at the 15th cycle in the first syndrome calculations, and subsequently, the second syndrome calculations are started from the 15th cycle and the calculations of S6 to S13 are completed at the 30th cycle. Therefore, the address information n0 to n8 will be obtained after 30 cycles from the input of C0 which is the beginning of the code sequence.

Figure 9:
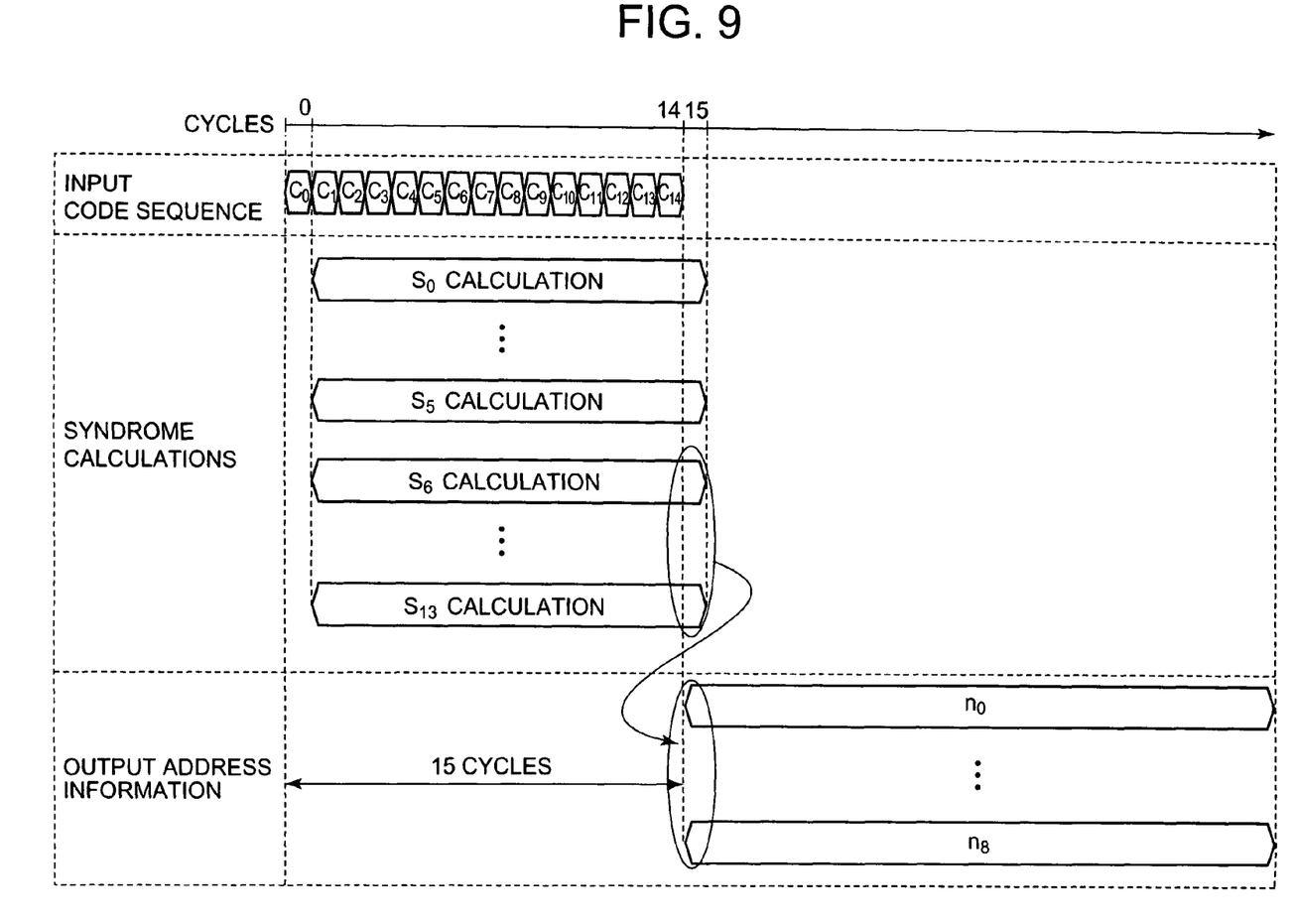
FIG. 9 is a timing chart showing a processing time for the error correction decoding apparatus of the present invention (in the case where there is no error in the code sequence)

In contrast to this, in a timing chart showing an approach according to the embodiment of the present application as shown in FIG. 9, when C0 to C14 have been inputted as the code sequence, the first syndrome calculations and the second syndrome calculations are parallelly executed, and thereby S0 to S5 and S6 to S13 will be obtained at the 15th cycle. Therefore, the address information n0 to n8 will be obtained after 15 cycles from the input of C0 which is the beginning of the code sequence, and the address information can be outputted in a time which is half of that in FIG. 8.

Figure 10:
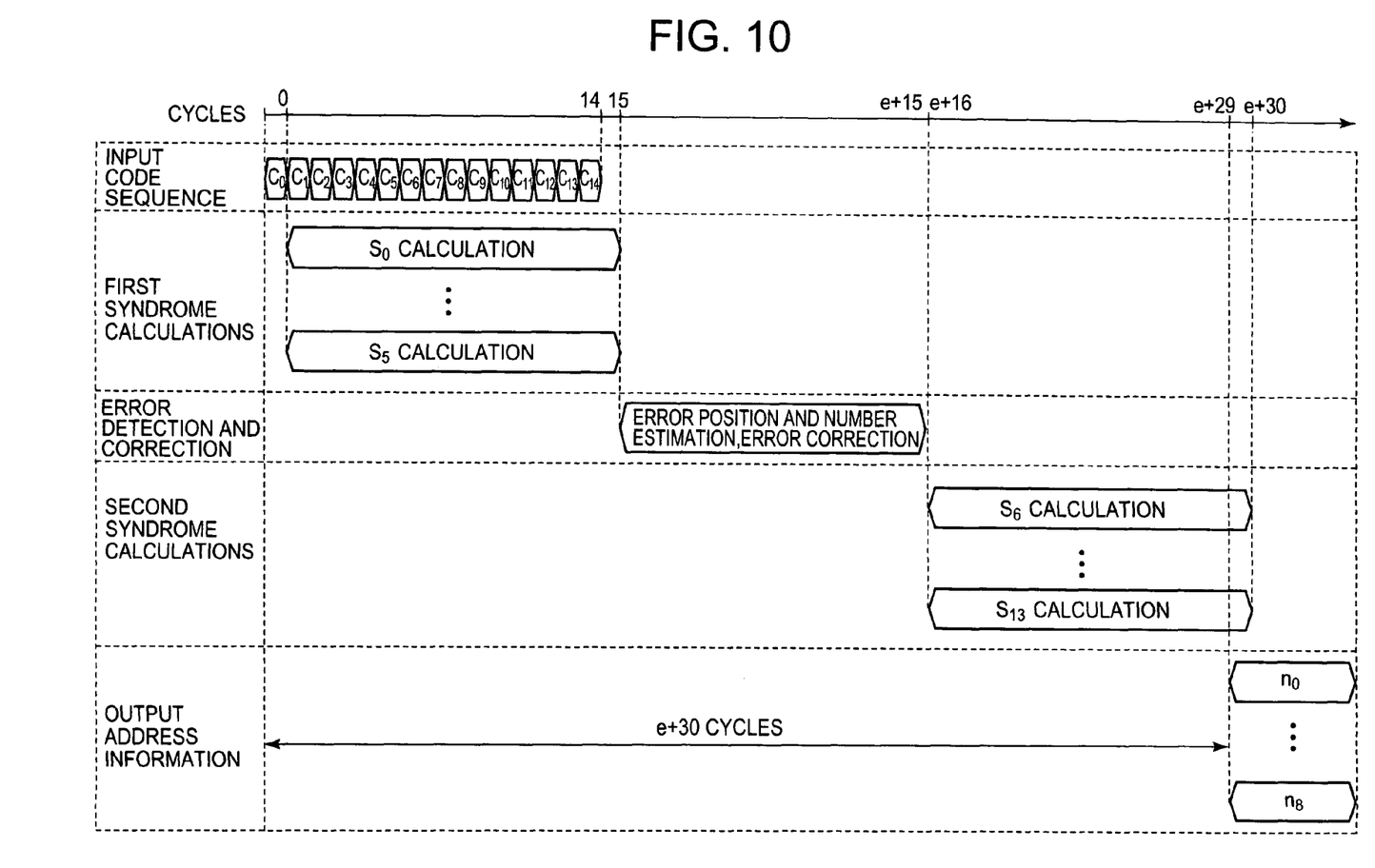
FIG. 10 is a timing chart showing the processing time for the error correction decoding apparatus applied with the approach shown in Japanese Patent Laid-Open No. 2000-286718 (in the case where there is the error in the code sequence)

On the other hand, if there is an error in C0 to C(i−1), the processing time for the error correction decoding method of dividing the syndrome calculations into two steps as shown in Patent Document 1 is (2*i)+e cycles, whereas the processing time for the present invention is i+e+1 cycles, which enables the high speed decoding process. It should be noted that since the processing time required for error determination and error information generation varies depending on the number of errors, the processing time is assumed as e cycles here. FIG. 10 shows the processing time for the approach of Patent Document 1 and FIG. 11 shows the processing time for the present invention, in the case where the code length i=15 and the information length j=9 are assumed and there is the error in the code sequence.

A timing chart showing the approach according to Patent Document 1 as shown in FIG. 10 is similar to FIG. 8 until the first syndromes are obtained. However, subsequently, the cycle e for the error position and number estimation as well as the error correction is executed, and then the second syndrome calculations are executed similarly to FIG. 8. Thereby, the address information is outputted in e+30 cycles.

Figure 11:
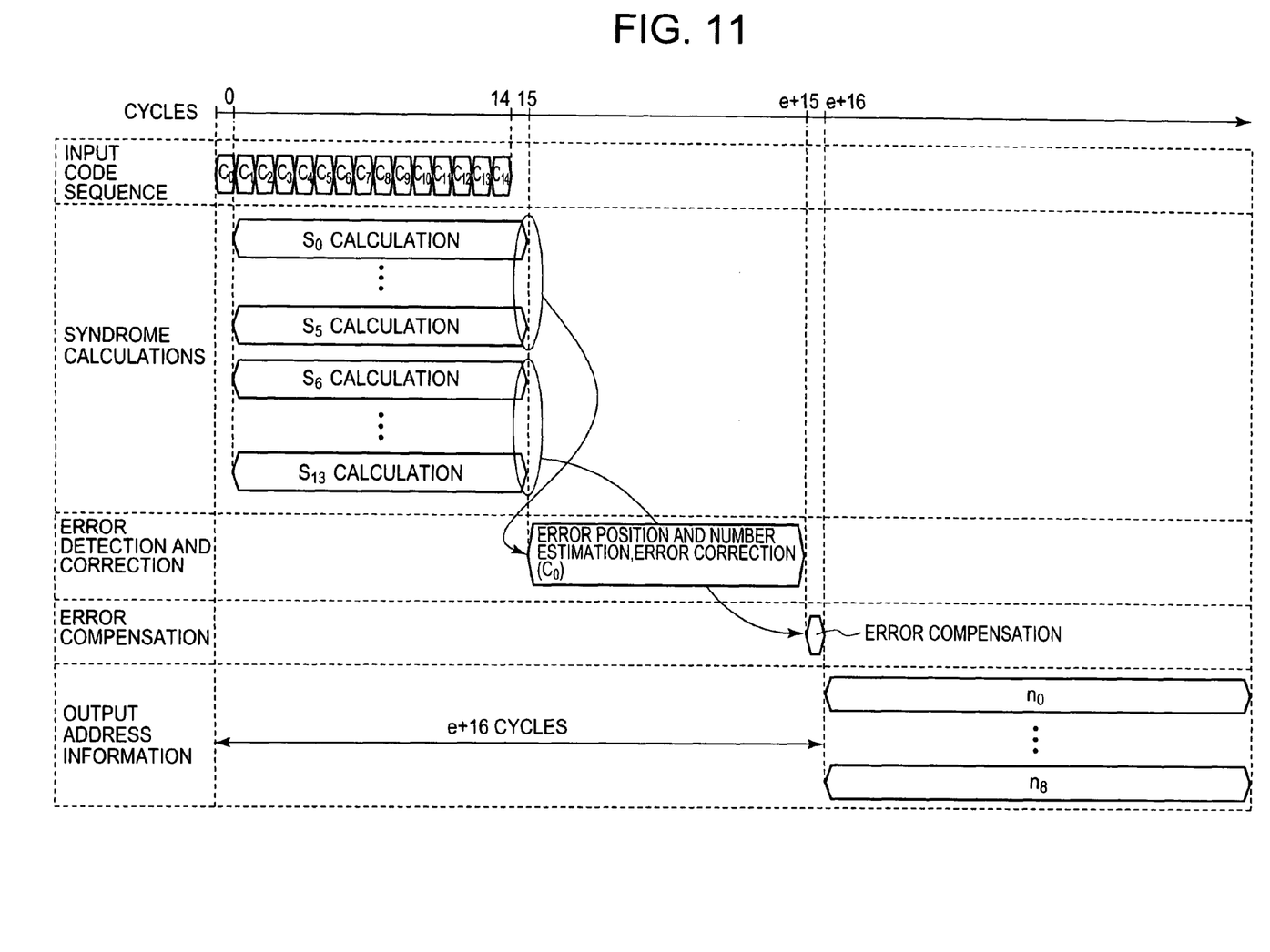
FIG. 11 is a timing chart showing the processing time for the error correction decoding apparatus of the present invention (in the case where there is the error in the code sequence).

In contrast to this, a timing chart of the embodiment of the present application as shown in FIG. 11 is the same as FIG. 9 until the first syndrome calculations and the second syndrome calculations are obtained. However, subsequently, the error position and number estimation as well as the error correction are executed, with which a result of the second syndrome calculations is corrected. Therefore, if the cycle of the error compensation is 1 cycle, the address information can be outputted in e+15+1 cycles. It should be noted that, in the process of obtaining the compensation value, as shown in FIG. 7, the exponentiation values of the error positions can be calculated from the constant tables and furthermore the compensation value can be calculated in 1 cycle with simple multiplication and addition.

It should be noted that, of course, the embodiment of the present application can be appropriately modified in a range not deviating from the gist of the above described invention.

What is claimed is:

1. An error correction decoding circuit for a playing signal having a code sequence, comprising:
   a decoding unit generating first decoded signal and second decoded signal based on the code sequence; and
   an error correction unit performing error correction for the second signal in response to the first signal.

2. The error correction decoding circuit according to claim 1, wherein the decoding unit includes the syndrome calculation unit generating first syndrome that is included in the first signal and second syndrome that is included in the second signal.

3. The error correction decoding circuit according to claim 2, wherein the syndrome calculation unit comprises:
   a first syndrome calculation unit generating the first syndrome based on the code sequence;
   a second syndrome calculation unit generating the second syndrome based on the code sequence.

4. The error correction decoding circuit according to claim 3, wherein the error correction unit comprises:
   an error detect circuit providing information based on the first syndrome; and
   an error compensation unit performing error compensation for the second syndrome in response to the information.

5. The error correction decoding circuit according to claim 4, wherein the error detect unit comprises:
   an error-position estimation unit estimating error-position in response to the first syndrome to produce estimated error-position that is included in the information; and
   an error-number estimation unit estimating error-number in response to the first syndrome to produce estimated error-number that is included in the information.

6. The error correction decoding circuit according to claim 5, wherein the error compensation unit comprises:
   a constant table unit lookupping a constant table in response to the estimated error-position to output predetermined value;

a multiplication unit multiplying the predetermined values to the estimated error-number to output multiplied value; and an adder unit performing a sum of the multiplied value and the second syndrome.

7. An address decoding circuit for ADIP (Address in Pre groove) data having a code sequence, comprising:

a syndrome calculation unit generating first syndrome and second syndrome based on the code sequence; and an error correction unit performing error correction for the second syndrome in response to the first syndrome to generate corrected syndrome, and outputting address data in response to the corrected syndrome.

8. The address decoding circuit according to claim 7, wherein the syndrome calculation unit comprises:

a first syndrome calculation unit generating the first syndrome based on the code sequence;

a second syndrome calculation unit generating the second syndrome based on the code sequence while executing the first syndrome calculation unit.

9. An address decoding method for ADIP (Address in Pre groove) data having a code sequence, comprising:

generating first syndrome and second syndrome based on the code sequence;

performing error correction for the second syndrome in response to the first syndrome to generate corrected syndrome when detecting error in the first syndrome; and outputting address data in response to the corrected syndrome.

10. An address decoding method according to claim 9, further comprising:

outputting address data in response to the second syndrome when detecting no error in the first syndrome.

* * * * *